USO05625599A

United States Patent [19]

Okamura

[11] Patent Number: 5,625,599
[45] Date of Patent: Apr. 29, 1997

[54] SEMICONDUCTOR MEMORY HAVING DECODED SENSE AMPLIFIER DRIVE LINES

[75] Inventor: Junichi Okamura, Kanagawa-ken, Japan

[73] Assignee: Kabushiki Kaisha Toshiba, Tokyo, Japan

[21] Appl. No.: 548,386

[22] Filed: Oct. 26, 1995

[30] Foreign Application Priority Data

Nov. 10, 1994 [JP] Japan .................................. 6-276260

[51] Int. Cl.$^6$ ........................................................ G11C 7/00
[52] U.S. Cl. ........................................... 365/205; 365/190
[58] Field of Search ................................ 365/190, 205, 365/207, 208

[56] References Cited

U.S. PATENT DOCUMENTS

| 4,158,241 | 6/1979 | Takemae et al. | 365/205 |
| 4,780,850 | 10/1988 | Miyamoto | 365/205 |
| 5,023,842 | 6/1991 | Okada | 365/205 |
| 5,367,493 | 11/1994 | Yamagata | 365/205 |

Primary Examiner—David C. Nelms
Assistant Examiner—Son Mai
Attorney, Agent, or Firm—Loeb & Loeb LLP

[57] ABSTRACT

In a DRAM or similar memory having sense amplifiers coupled to memory cells, a sense amplifier is switchably connected to a discharge circuit to discharge the terminal of the sense amplifier at high speed. The node of the sense amplifier is also coupled to a discharge circuit which discharges the node at a slower speed. In operation, only the node of a selected sense amplifier is discharged at high speed, while other non-selected sense amplifiers are activated by discharging the sense amplifier node at a lower speed. This mode of operation allows for the high speed activation of the selected sense amplifier with the associated current consumption being limited to that necessary to discharge the individual sense amplifier selected. The two discharge circuits may be two N channel MOS transistors connecting the node of the sense amplifier to two drive lines driven by independent circuits. The higher speed discharge circuit is implemented as an N channel MOS transistor which is switched by a signal from the column select line.

31 Claims, 10 Drawing Sheets

SEMICONDUCTOR MEMORY HAVING DECODED SENSE AMPLIFIER DRIVE LINES

FIELD OF THE INVENTION

The present invention relates to a semiconductor memory and, more particularly, to a memory such as a dynamic random access memory having a shorter access time without increased power consumption.

BACKGROUND OF THE INVENTION

Figure 10A:
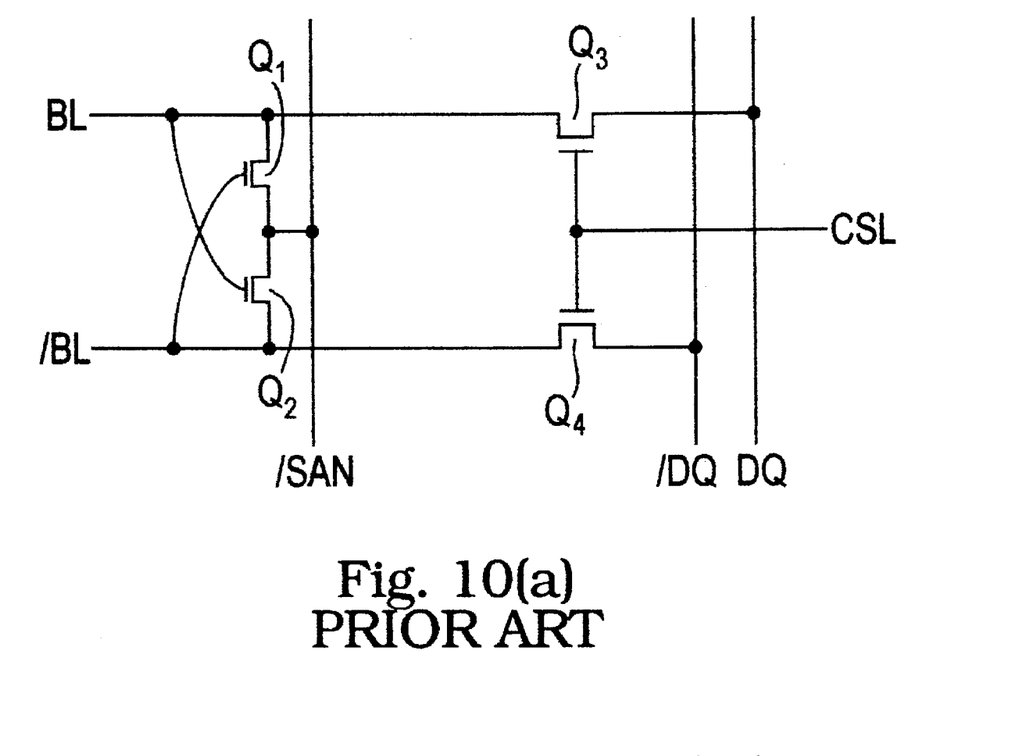
FIG. 10(a) and 10(b) are circuit diagrams showing peripheral circuits within a core section of a conventional semiconductor memory.

FIG. 10(a) shows a peripheral circuit within a memory array of a conventional semiconductor memory. Within the peripheral circuit, a sense amplifier is connected to a pair of bit lines BL and/BL to which a dynamic-type memory cell, not shown, is connected. The sense amplifier includes N-channel MOS transistors Q1 and Q2 connected in series between bit lines BL and/BL, with the drain and gate of each transistor connected to a different bit line and with the sources of the transistors connected in common to a sense amplifier drive signal line/SAN. A column select circuit is constituted by N-channel MOS transistors Q3 and Q4. MOS transistor Q3 is connected between the bit line BL and a data line DQ, and MOS transistor Q4 is connected between the bit line/BL and a data line/DQ, respectively. The gates of the MOS column select transistors are commonly connected to a column select line CSL.

The FIG. 10(a) circuit operates as follows. When a word line, not shown, is activated and the memory cell is selected, a very small potential difference is generated between the pair of bit lines BL and/BL. Next, the potential of the sense amplifier drive line/SAN is changed from ½ $V_{CC}$ (corresponding to a voltage of approximately a half of an internal power source voltage) to $V_{SS}$ (ground potential). Consequently, the very small potential difference between BL and/BL is amplified by MOS transistors Q1 and Q2 and the potential of either one of BL and/BL falls to a potential of $V_{SS}$. The amplified potential difference is transferred to the pair of data lines DQ and /DQ via the column select transistors Q3 and Q4 and then the potential difference is converted into a logic signal level by a data line amplifying circuit, not shown, so that the sensed potential difference is read out from the chip as an output data.

It has conventionally been difficult to sufficiently reduce the access time required for the circuit shown in FIG. 10(a) for the following reasons. Although only a single pair of bit lines are shown for simplicity in FIG. 10(a), actually several hundreds of pairs of bit lines are typically driven by the same sense amplifier drive line/SAN. Accordingly, it is difficult to drive the sense amplifier drive line/SAN at high speed even when MOS transistors having a high drive capacity are used to drive the line/SAN. The large capacitance of the sense amplifier drive line/SAN prevents the drive circuitry from quickly activating the sense amplifiers, has been one obstacle to speeding up conventional dynamic-type memory.

Figure 10B:
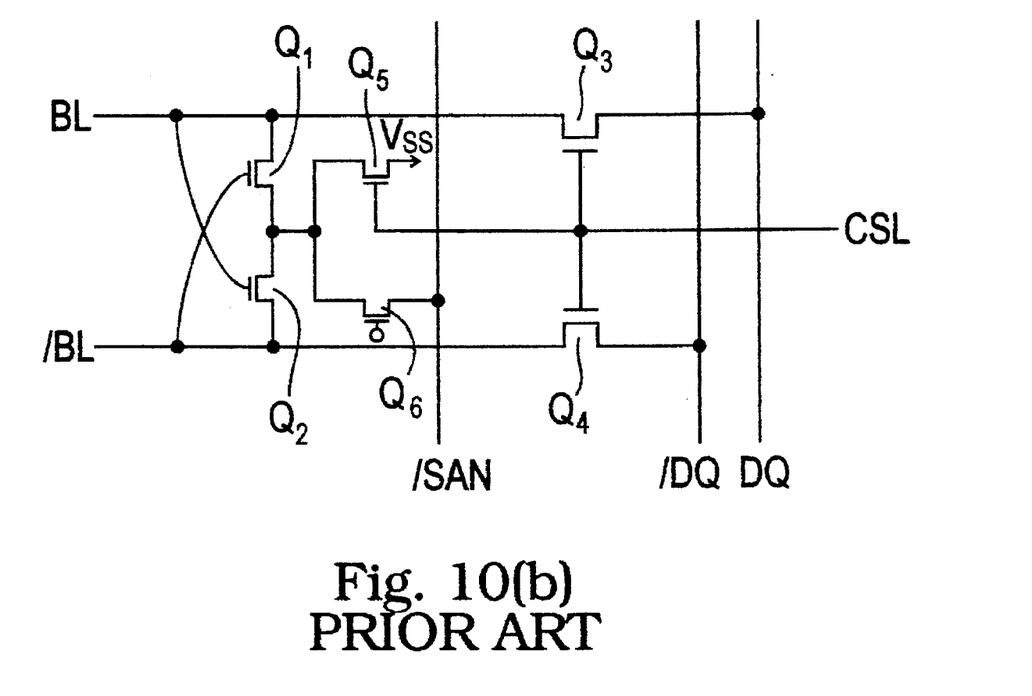

A peripheral circuit like that shown in FIG. 10(b) has been developed to attempt to address the above problem. The circuit of FIG. 10(a) is modified to provide the circuit of FIG. 10(b) by adding a MOS transistor Q5 connected between a common source terminal of the sense amplifier and the ground potential and a MOS transistor Q6 connected between the common source terminal and the sense amplifier drive line/SAN. The gate of MOS transistor Q5 is driven by the column select line CSL and the gate of MOS transistor Q6 is connected to the $V_{CC}$ (the internal power source potential).

Next, the operation of the FIG. 10(b) circuit is described. When a word line, not shown, is activated and the memory cell is selected, a very small potential difference arises between the pair of bit lines BL and/BL. Next, the potential of the sense amplifier drive line/SAN changes from ½ $V_{CC}$ (approximately one half of the internal power source voltage) to $V_{SS}$ (ground potential). As in the FIG. 10(a) circuit,/SAN does not change rapidly because of the large capacitance of the line driven by/SAN. Next, the potential of the column select line CSL changes from $V_{SS}$ to $V_{CC}$ for column selection whether or not/SAN has reached $V_{SS}$. When CSL switches to $V_{CC}$ ("high"), the MOS transistor Q5 is driven to turn on, the node at the sources of the sense amplifier transistors Q1, Q2 falls to $V_{SS}$, and the sense amplifier is driven at high speed. As a result, a very small potential difference is amplified at high speed by the operation of the MOS transistors Q1 and Q2 and one of the potentials of BL or/BL quickly falls to $V_{SS}$. The amplified potential difference is transferred to the pair of data lines DQ and/DQ via the column transistors Q3 and Q4 and the amplified potential difference is converted into a logic level signal by a data line amplifying circuit, not shown, and the amplitude difference is read out from the chip as data. Sense amplifiers connected to pairs of bit lines other than the pair of bit lines selected by the column select line CSL are driven only by the sense amplifier drive lines/SAN in a manner similar to that of the FIG. 10(a) circuit so that the non-selected bit lines are driven at low speed compared with the selected pair of bit lines. According to the circuit shown in FIG. 10(b), it is possible to speed up operation without significantly increasing power consumption because only the sense amplifier corresponding to the selected column is activated at higher speed It is difficult to use the circuit shown in FIG. 10(b) in a dynamic-type memory of the type shown in FIG. 3. In the illustrated memory, a number of memory cell arrays ("Cell") are arranged alternatively along the row direction. Row selection is performed by a common column decoder circuit C/D using a common column select line CSL. When the column select line CSL goes high to selected one memory cell at high speed in the FIG. 10(b) circuit, all the sense amplifiers connected to the same column select line CSL are activated. In addition, when the sense amplifier connected to the particular memory cell is activated, all the sense amplifiers belonging to the particular memory cell array Cell which includes the selected memory cell are activated. Thus, a cross-shaped group of sense amplifiers including one row and one column are simultaneously activated so that a high level of current consumption accompanies the activation of the selected sense amplifier. To implement the peripheral circuit of FIG. 10(b) in a memory such as the one shown in FIG. 3, then, it is necessary to arrange a column decode circuit C/D for each memory cell array Cell. This is because each of the common CSL must be driven independently to reduce access speed without increasing power consumption. Providing the large number of column decode circuits necessary to implement a circuit having the sufficient number of column decoders requires a substantial and undesirable increase in the chip area.

SUMMARY OF THE INVENTION

It is an object of the present invention to resolve the above-mentioned drawbacks and to provide a semiconductor memory achieving faster access without increasing the chip area and without increasing power consumption.

To achieve the above object, one aspect of the present invention provides a semiconductor memory having an array of memory cells and a plurality of bit line pairs, where each of the bit line pairs is coupled to at least one memory cell. The memory includes a column selection line for selecting a pair of bit lines from the plurality of bit line pairs and a first driver circuit for driving the column selection line in response to first address signals. The memory includes a sense amplifier comprising a first and a second transistor, with the drain of the first transistor connected to a particular first bit line, the gate of the first transistor connected to a corresponding second bit line and the source of the first transistor connected to a first node, and the drain of the second transistor connected to the corresponding second bit line, the gate of the second transistor connected to the particular first bit line and the source of the second transistor connected to the first node. A first sense amplifier drive line is coupled to a switch for switchably connecting the first node to the first sense amplifier drive line. The switch is controlled by the column selection line to provide a first potential to the first node to place the sense amplifier in an inactive state, the switch means providing a second potential to the first node to place the sense amplifier in an active state.

In accordance with another aspect of the present invention, a semiconductor memory includes core blocks each having a memory cell block in which a plurality of memory cells are arranged in a matrix and which includes alternately arranged pluralities of memory cell arrays each constituted by connecting the memory cells in the same column by the same pair of bit lines and peripheral circuits within a core section constituted by a plurality of column select transistors each connected to the pair of bit lines and a plurality of sense amplifier circuits each connected to the pairs of bit lines both in columns, a plurality of column select lines extending over the plurality of memory cell arrays for selectively driving the plurality of column select transistors arranged in parallel with the pair of bit lines in the same row, a column select line selecting circuit for selecting and driving the column select lines based on a first address signal inputted from the outside, pluralities of first and second sense amplifier drive lines arranged along the peripheral circuits within a core section, a sense amplifier drive line selecting circuit for selecting and driving the pluralities of first and second sense amplifier drive lines based on a second address signal inputted from the outside, a plurality of resistor elements respectively arranged between a plurality of sense amplifier circuits and the first sense amplifier drive lines and a plurality of sense amplifier activating transistors respectively connected between the plurality of sense amplifier circuits and the second sense amplifier drive lines which are driven by the column select lines.

According to this aspect of the present invention, column select lines extend over a plurality of memory cell arrays, making it possible to commonly use the column select line selecting circuit for a plurality of memory cell arrays, thereby reducing the chip area.

In accordance with a further aspect of the invention, the sense amplifier activating transistor provided at each sense amplifier and connected between the drive terminal of the sense amplifier and the second sense amplifier drive line is driven by the column select line. Therefore, a particular sense amplifier belonging to the memory cell selected in accordance with the row and column addresses can be activated at high speed by selecting only the second sense amplifier drive line in the memory cell array to which the selected memory cell belongs. At the same time, the first sense amplifier drive line selects the sense amplifiers belonging to the selected memory cell array other than the array to which the selected memory cell belongs in such a manner that the non-selected sense amplifiers are activated at a normal speed. Since most of the sense amplifiers are not driven at high speeds during the activation of the selected sense amplifiers, improved access speeds can be achieved without increasing power consumption.

Within a still further aspect of the invention, the current required to drive the first sense amplifier drive line is comparatively large since it must simultaneously activate the sense amplifiers of one row. However, the current required to drive the second sense amplifier drive line is comparatively small since it activates only the sense amplifier selected by the column select line. The sense amplifier drive line selecting circuit drives the first and the second sense amplifier drive lines independently. Since a resistor element is respectively connected between the first sense amplifier drive line and the drive terminal of the sense amplifier for each sense amplifier, the second sense amplifier drive line is not influenced by the potential of the first sense amplifier drive line. Therefore, it is possible to drive the second sense amplifier drive line at high speed.

DETAILED DESCRIPTION OF PREFERRED EMBODIMENTS

Preferred embodiments of the present invention are described with reference to the drawings. Although the present invention can be used in a variety of semiconductor memory devices (SRAM, EPROM, MROM, etc.), the following explanation emphasizes the most common application presently known for the present invention, which is an embodiment of a DRAM. DRAMs represent particular preferred embodiments of the present invention because of the reduction in access time without increasing chip size or power consumption.

Figure 1:
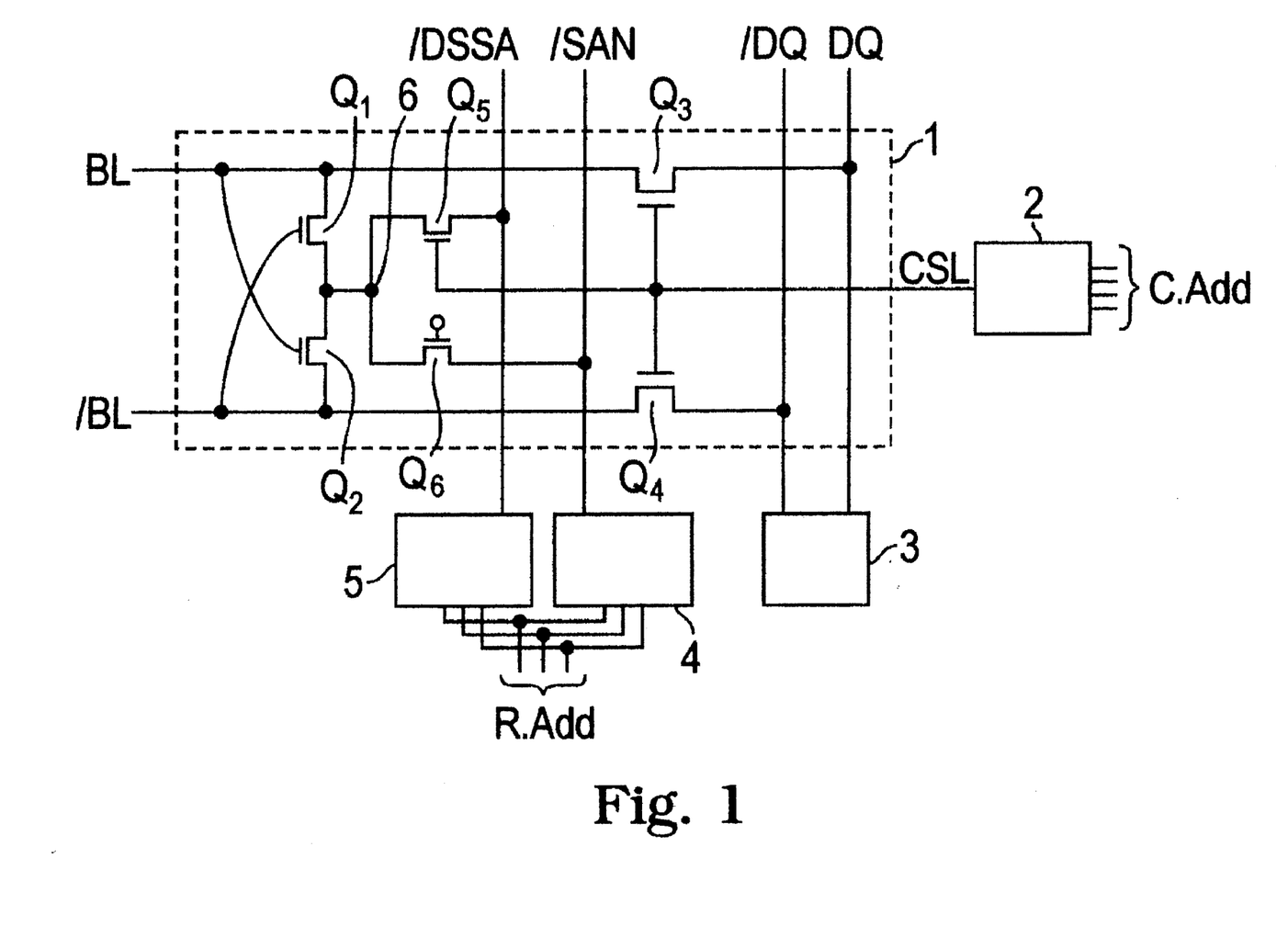
FIG. 1 is a circuit diagram illustrating as embodiment.

FIG. 1 is a circuit diagram illustrating a preferred embodiment of the present invention. Peripheral circuit 1 is typically formed within a core section comprising a plurality of arrays of memory cells. The FIG. 1 memory also includes a column select circuit 2, a data line amplifying circuit 3, a/SAN drive circuit 4, and a/DSSA drive circuit 5, among other circuits. In the peripheral circuit 1, the gate and the drain of each of the N-channel MOS transistors Q1 and Q2 are connected to an opposite one of a pair of bit lines BL and /BL. The sources of the transistors Q1 and Q2 are commonly connected to a sense amplifier drive terminal 6.

The column select circuit includes N-channel MOS transistor Q3 connected between the bit line BL and a data line DQ; the column select circuit also includes N-channel MOS transistor Q4 connected between the bit line/BL and the data line/DQ. The gates of both column select transistors Q3, Q4 are connected in common to the column select line CSL. N-channel MOS transistor Q6 is connected between the sense amplifier drive terminal 6 and a first sense amplifier line/SAN and the gate of NMOS transistor Q6 is connected to $V_{CC}$ so that the transistor Q6 operates as a resistor element. N-channel MOS transistor Q5 is connected between the sense amplifier drive terminal 6 and a second sense amplifier drive line/DSSA. The gate of NMOS transistor Q5 is connected to column select line CSL. Column select circuit 2 selectively drives the column select line CSL in response to column address signals C.Add, for example, in the manner well known on the art. The data line amplifying circuit 3 amplifies a very small potential difference between the data line DQ and/DQ to a logic level signal in the typical manner. Both the/SAN drive circuit 4 and the /DSSA drive circuit 5 constitute sense amplifier drive line selecting circuits which operate to simultaneously but independently drive the lines/SAN and/DSSA in response to the row address signals R.Add input from the outside of the memory.

The circuit of FIG. 1 operates as follows. When a word line, not shown, is activated and the memory cell is selected, a very small potential difference is generated between the pair of bit lines BL and/BL. The potentials of the first and the second sense amplifier drive lines/SAN and /DSSA change from ½ $V_{CC}$ approximately one half of the internal power source voltage) to $V_{SS}$ (ground potential). Consequently, the very small potential difference between bit lines BL and /BL is amplified by the MOS transistors Q1 and Q2 and either one of the potentials of BL and /BL falls to $V_{SS}$. When the potential of the selected column select line CSL rises to "H" level, the MOS transistor Q5 becomes conductive and only the sense amplifier connected to the selected CSL is activated at higher speed. The amplified potential difference is transferred to the pair of data lines DQ and/DQ via the column select transistors Q3 and Q4, the potential difference is then converted into a logic level signal by the data line amplifying circuit 3, and data are read out from the chip.

Together, the/SAN drive circuit 4 and the/DSSA drive circuit 5 constitute the sense amplifier drive line selecting circuit, and operate to simultaneously but independently drive/SAN and/DSSA in response to the row address signals R.Add inputted from outside the chip /SAN has a comparatively large parasitic capacitance since it must simultaneously activate the sense amplifiers of an entire column, while/DSSA has a comparatively small parasitic capacitance because/DSSA activates only the sense amplifier selected by CSL. The sense amplifier drive line selecting circuits 4 and 5 drive both the first and the second sense amplifier drive lines, but each MOS transistor Q6 acts as a resistor element connected between/SAN and the sense amplifier drive terminal 6 adjacent each sense amplifier. Consequently,/DSS does not couple to /SAN and /DSSA is not influenced by the comparatively large capacitance of/SAN. Therefore, /DSSA can be driven at high speed regardless of the capacitance of/SAN.

Next, a preferred embodiment of the present invention implemented in a 64 Mbit DRAM will be described with reference to FIG. 2 through FIG. 9.

Figure 2:
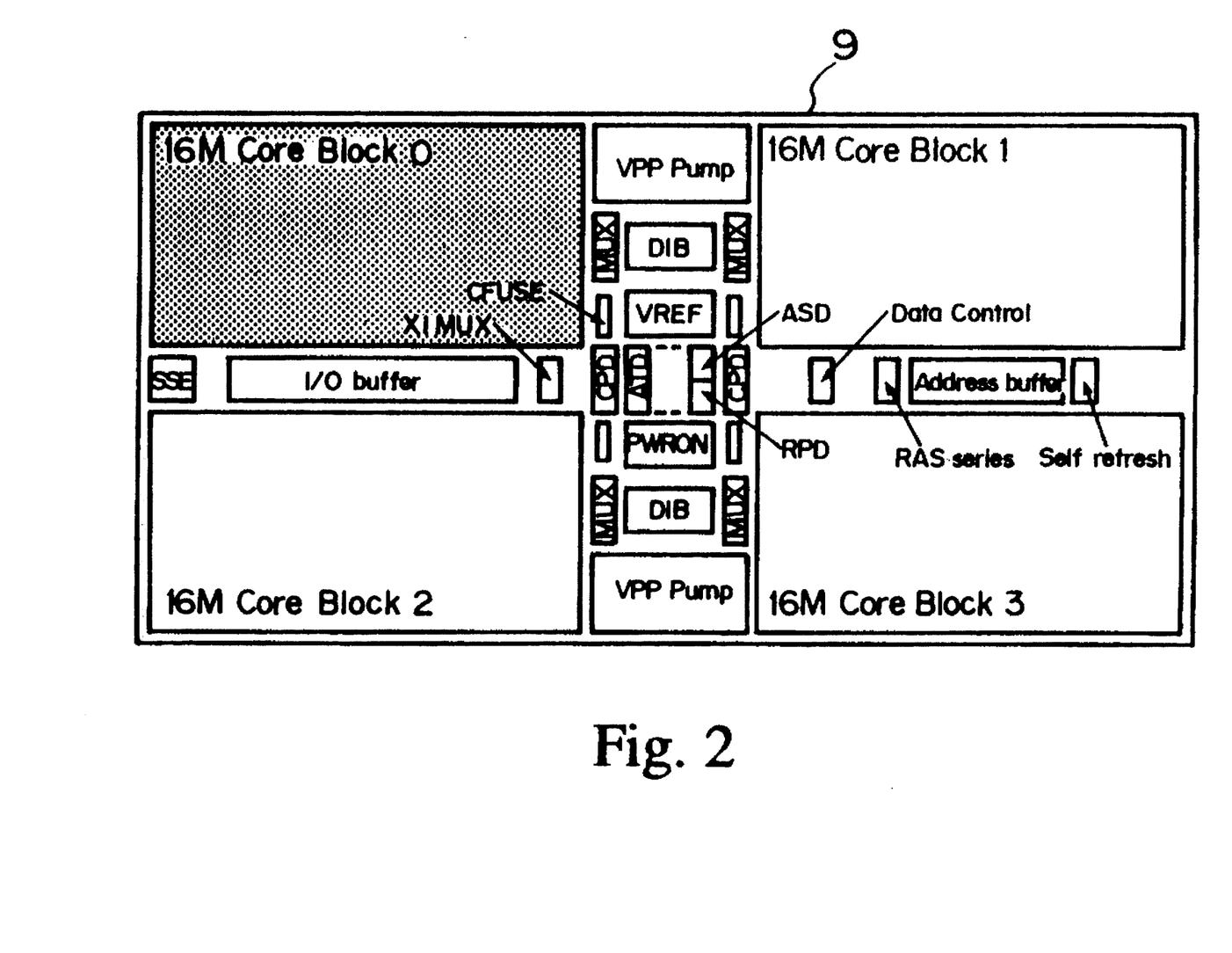
FIG. 2 is a plan view showing a semiconductor memory of an embodiment of the present invention.

FIG. 2 shows schematically a layout of a DRAM in accordance with the present invention. The total memory capacity of the exemplary DRAM is assumed to be 64 Mbits. Semiconductor chip 9 includes core blocks CB0, CB1, CB2, and CB3, each of which has a sufficient number of memory cells to store 16 Mbits of data and each of which includes such associated peripheral circuits as sense amplifiers, decoders and other circuits of the type which are typically present in an array of memory cells. $V_{PP}$ generating circuits VPP Pump each generate a boosted voltage $V_{PP}$ for a word line, and are arranged between respective pairs CB0 and CB1, and CB2 and CB3. Data multiplexer circuits MUX and data buffer circuits DIB are arranged to be adjacent to data output units of the respective core blocks CB. Fuse arrays CFUSE which hold data identifying which column redundancy circuits are in use are arranged adjacent the respective core blocks. A reference voltage generating circuit VREF generates a reference potential that is an intermediate potential of, for example, ½ $V_{CC}$, etc. is arranged between CB0 and CB1. Power-on reset circuit PWRON generates an initializing signal when the internal portion of the chip is initialized after the power source turns on is located between core blocks CB2 and CB3. A substrate potential generation circuit SSB, a data input/output (I/O) buffer and pads, an I/O data multiplexer circuit X1MUX for selecting a pad in accordance with the data output width are arranged between CB0 and CB2. A self refresh control circuit, an address buffer, a row series control circuit RAS and a data control circuit DC are arranged between CB1 and CB3. Column partial decoder circuits CPD, an address transition detection circuit ATD, a row partial decoder circuit RPD and a column address switch circuit ASD are arranged near the central portion of the chip 9.

Figure 3:
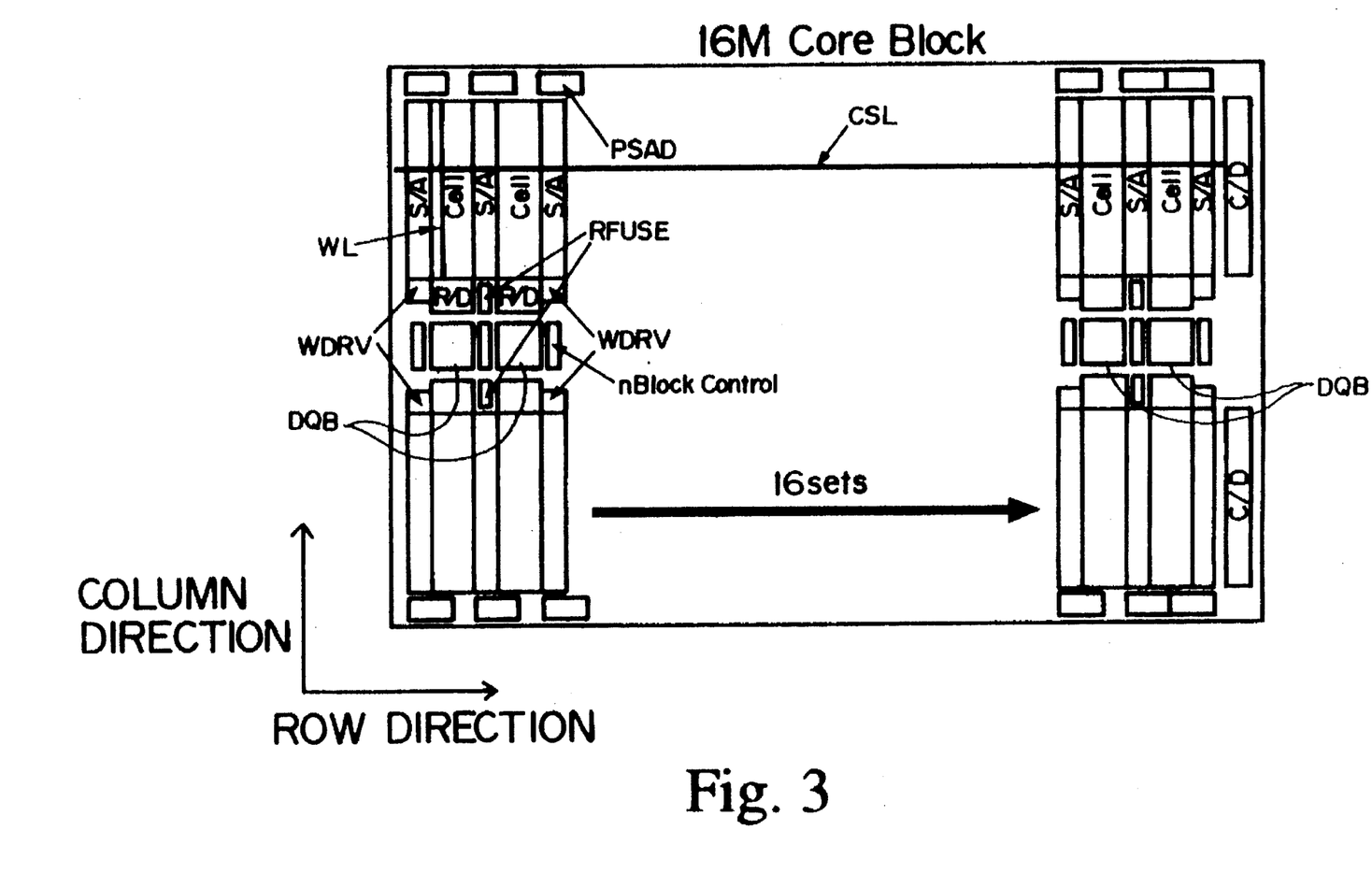
FIG. 3 is a plan view showing in details important portions of FIG. 2.

FIG. 3 shows the structure of one of the 16 Mbit core block CB. Thirty-two sets of memory cell arrays Cell and thirty-three sets of peripheral circuits within a core section S/A are alternatively arranged to make up the memory cell block; column decoder circuits C/D are arranged at one end of each of the rows of memory arrays and peripheral circuits. A plurality of column select lines CSL are arranged in the row direction, with the CSLs being selectively driven by the column decoder circuits C/D. The column select lines CSL supply select signals to the peripheral circuits within the core sections S/A for each column belonging to the same row. More particularly, the column select line is used for partial activation of the sense amplifier circuits and for driving column gate circuits. The 16 Mbit core block CB is divided into a top and bottom group. Arranged between the top and bottom groups are row decoder circuits R/D, each corresponding to one memory cell array, for selectively driving word lines WL with internal row address signals. Also located between the top and bottom rows are circuits WDRV for supplying drive signals to the row decoder circuits, circuits RFUSE for holding data about replaced row redundancy circuits, data line amplifying circuits DQB, a block control circuit BC and other related circuits. P-channel type sense amplifier drive circuits PSAD corresponding to each peripheral circuit within a core section are arranged at peripheral portions of the core blocks CB.

Figure 4:
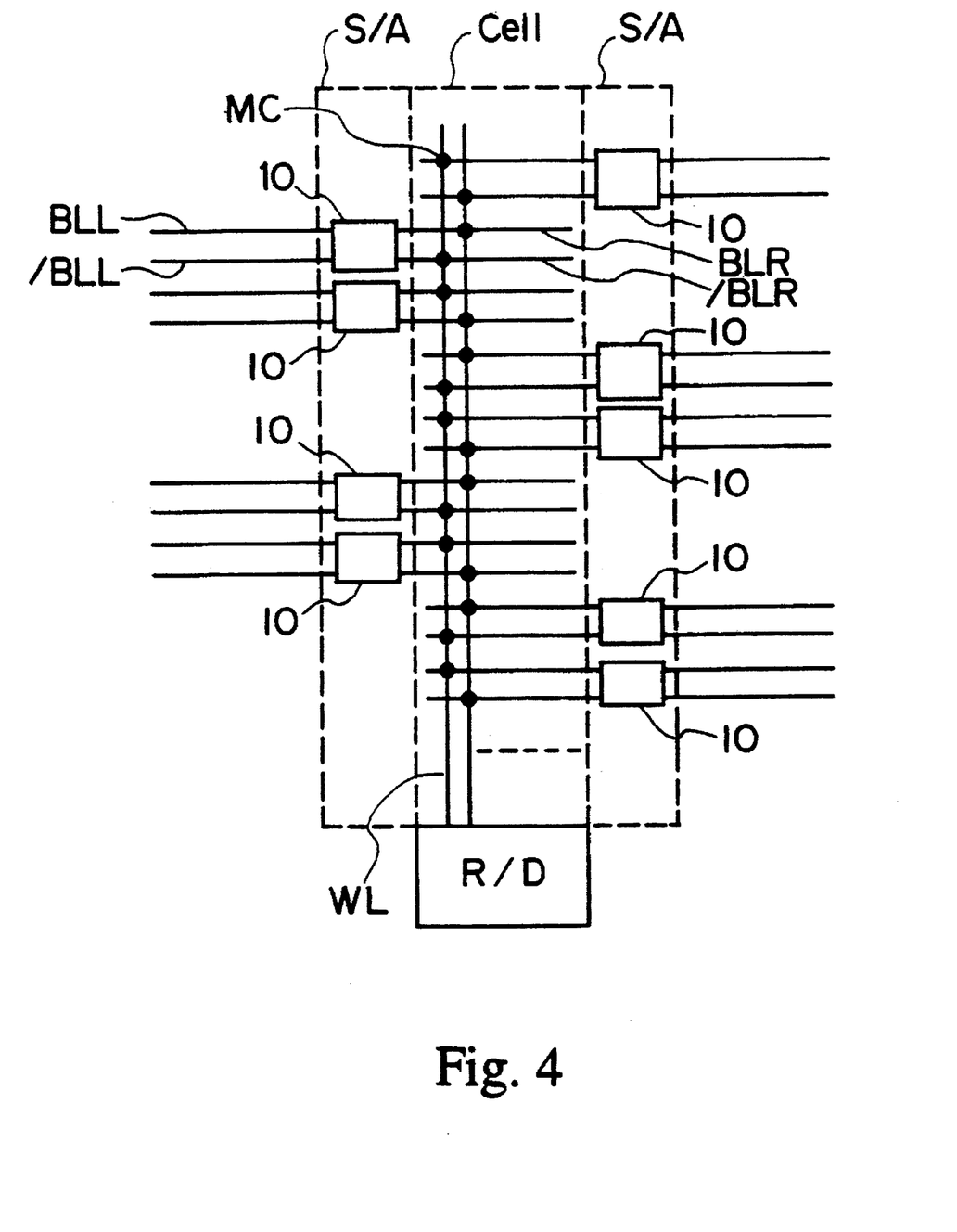
FIG. 4 shows of the FIG. 3 circuit.

FIG. 4 shows an exemplary structure of the memory cell array Cell interposed between the peripheral circuits within two core sections S/A. Two pairs of bit lines BLL and/BLL and BLR and/BLR are connected to each sense amplifier circuit 10 in a shared sense amplifier structure and the memory cell array is organized by grouping four bit lines together and coupling those four bit lines to two sense amplifiers located adjacent to one another on one side of the memory array. A next group of four bit lines are grouped together and are coupled to a second set of two adjacent sense amplifiers on the other side of the memory array. The alternating bit line connection and sense amplifier locations take on the zigzag form as shown in FIG. 4. A plurality of dynamic-type memory cells MC consisting of a transistor and a storage capacitor are connected to each bit line. Memory cells MC belonging to the same column are connected to a single pair of bit lines and memory cells MC belonging to the same row are connected to one word line WL. The word lines WL are selectively driven by the row decode circuits R/D as mentioned above. The row decode circuits R/D each include at least a word line drive circuit for charging the word line to an "H" level using P-channel MOS transistors. Drive signal supply circuits WDRV (FIG. 3) drive the P-channel MOS transistors of the R/D circuits and the $V_{PP}$ generating circuits VPP Pump (FIG. 2) generate a boosted $V_{PP}$ as a power source for the transistors.

Figure 5:
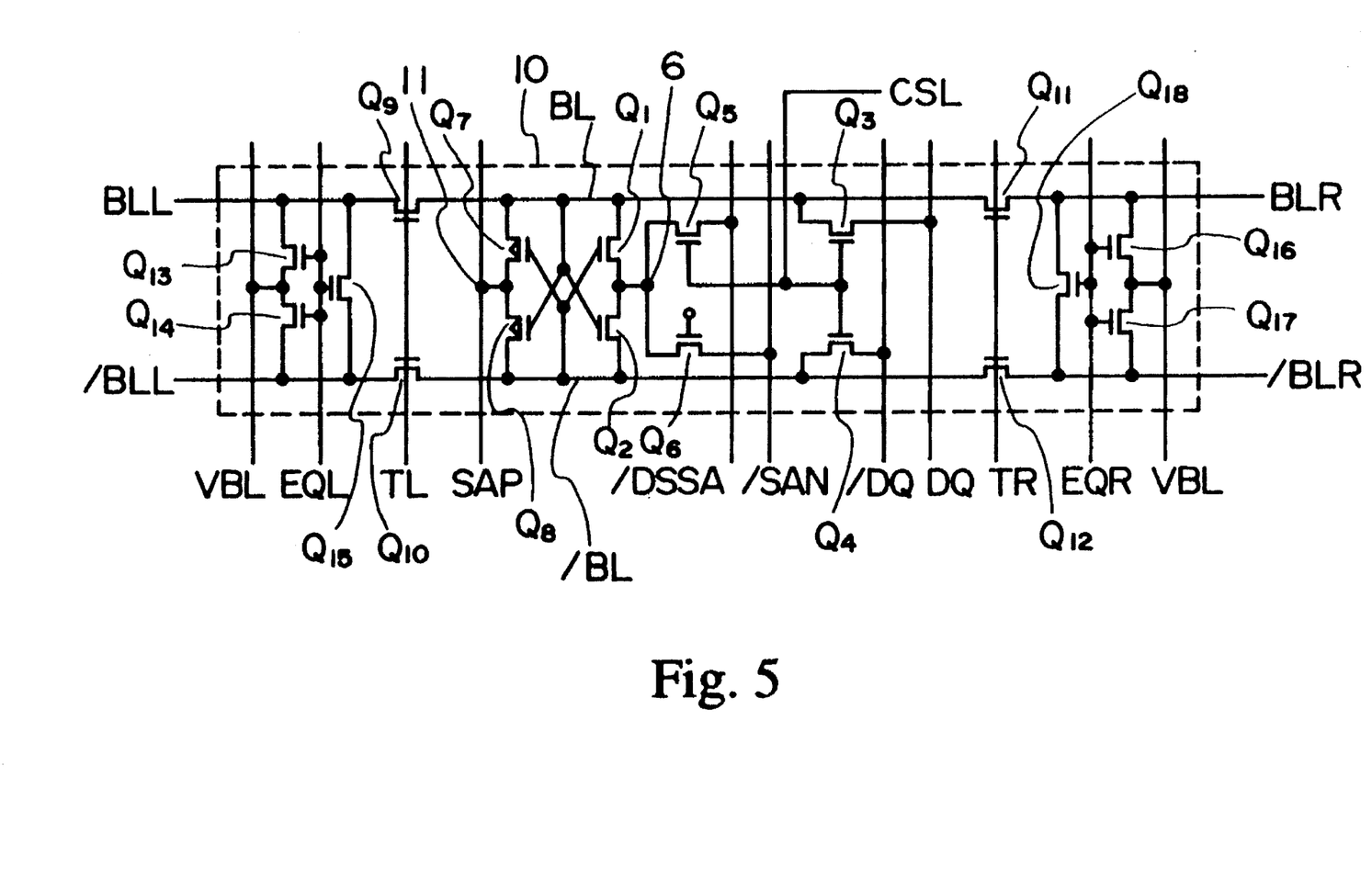
FIG. 5 is a circuit diagram showing more details of the FIG. 4 circuit.

FIG. 5 shows in greater detail the sense amplifier circuit 10 of FIG. 4. The pair of bit lines BL and/BL are switchably connected to a left side pair of bit lines BLL and/BLL, respectively, via N-channel MOS transistors Q9 and Q10, which are driven by a signal line TL. Bit lines BL and/BL are switchably connected to a right side pair of bit lines BLR and /BLR, respectively, via N-channel MOS transistors Q11 and Q12, which are driven by a signal line TR. An N-channel sense amplifier section includes N-channel MOS transistors Q1 and Q2 and a P-channel sense amplifier section is constituted by P-channel MOS transistors Q7 and Q8. Both the N-channel and the P-channel sense amplifier sections are connected to the pair of bit lines BL and/BL. The drive terminal 6 of the N-channel sense amplifier is connected to/DSSA via a MOS transistor Q5 driven by the column select line CSL, and the drive terminal 6 is connected to/SAN via a MOS transistor Q6 driven by $V_{CC}$ so that transistor Q6 functions as a resistor element. A drive terminal 11 of the P-channel sense amplifier is connected to a P-channel sense amplifier drive signal line SAP. SAP is driven by the above-mentioned P-channel type sense amplifier drive circuit PSAD. Further, the bit lines BL and/BL are respectively connected to data lines DQ and /DQ via MOS transistors Q3 and Q4 driven by the column select line CSL. A very small potential difference between the data lines DQ and/DQ is amplified to a logic level signal by the above-mentioned data line amplifying circuits DQB. An equalizing circuit constituted by MOS transistors Q13, Q14 and Q15 is driven by a signal line EQL and is connected to the left side pair of bit lines BLL and/BLL so that a voltage of ½ $V_{CC}$ can be supplied from line VBL to the left side pair of bit lines during a equalizing period. An equalizing circuit constituted by MOS transistors Q16, Q17 and Q18 is driven by a signal line EQR and is connected to the right side pair of bit lines BLR and /BLR to supply a voltage ½ $V_{CC}$ from VBL to the right side pair of bit lines.

The sense amplifier circuit 10 shown in FIG. 3 through FIG. 5 operates as follows. It is assumed for this discussion that the selected memory cell is connected to the left side pair of bit lines. Line TL is driven with a signal of the "H" level, the MOS transistors Q9 and Q10 become conductive and the left side pair of bit lines are connected to the pair of bit lines BL, /BL. TR remains at the "L" level, the MOS transistors Q11 and Q12 remain off and the right side pair of bit lines are disconnected from the pair of bit lines BL./BL. The potential of EQL changes from "H" level to "L" level and the equalizing operation is ended. Successively, the word line WL is activated, the dynamic-type memory cell MC is selected, and a very small potential difference is generated between the pair of bit lines BL and/BL. Next, the potentials of the first and the second sense amplifier drive line/SAN and/DSSA change from ½ $V_{CC}$ to $V_{SS}$ (ground potential). Then, the very small potential difference is amplified by the operation MOS transistors Q3 and Q4 and the potential of one of either BL and/BL decreases toward $V_{SS}$. Here, the potential of the selected column select line CSL is changed to "H" level to make the MOS transistor Q5 conductive and only the sense amplifier connected to the CSL is selected for higher speed operation. The amplified potential difference is transferred to the pair of data lines DQ and/DQ via the column select transistors Q3 and Q4, converted into a logic level signal by the data line amplifying circuit 3, and is eventually provided by the chip as output data. The P-channel sense amplifier operates in parallel with the N-channel sense amplifier, amplifying the very small potential difference between the pair of bit lines by increasing the potential of SAP from ½ $V_{CC}$ to $V_{CC}$ so that the potential of either one of BL or/BL increases toward $V_{CC}$. As a result, after a predetermined time period has elapsed, both of the potentials of the left side pair of bit lines and the pair of bit lines are amplified to the logic level signals of $V_{CC}$ and $V_{SS}$, respectively. The parasitic capacitance of/SAN is comparatively large since it is required to simultaneously activate the sense amplifiers of an entire row and the parasitic capacitance of DSSA is comparatively small since it activates only the sense amplifier selected by CSL. A sense amplifier drive line selecting circuit, discussed below, drives the first and the second sense amplifier drive lines /SAN and /DSSA independently. Since the MOS transistors Q6 connected between/SAN and the drive terminal 6 of the sense amplifier act as resistor elements isolating the sense amplifier drive lines at each sense amplifier./DSSA is not influenced by the potential of the/SAN line. Therefore, it is possible to drive line/DSSA at high speed.

Although a case where the selected memory cell is connected to the left side pair of bit lines has been explained above, the case where the selected memory cell is connected to the right side pair of bit lines is approximately similar to the case described above. Accordingly, an explanation of the right side connection configuration will be omitted.

Figure 6:
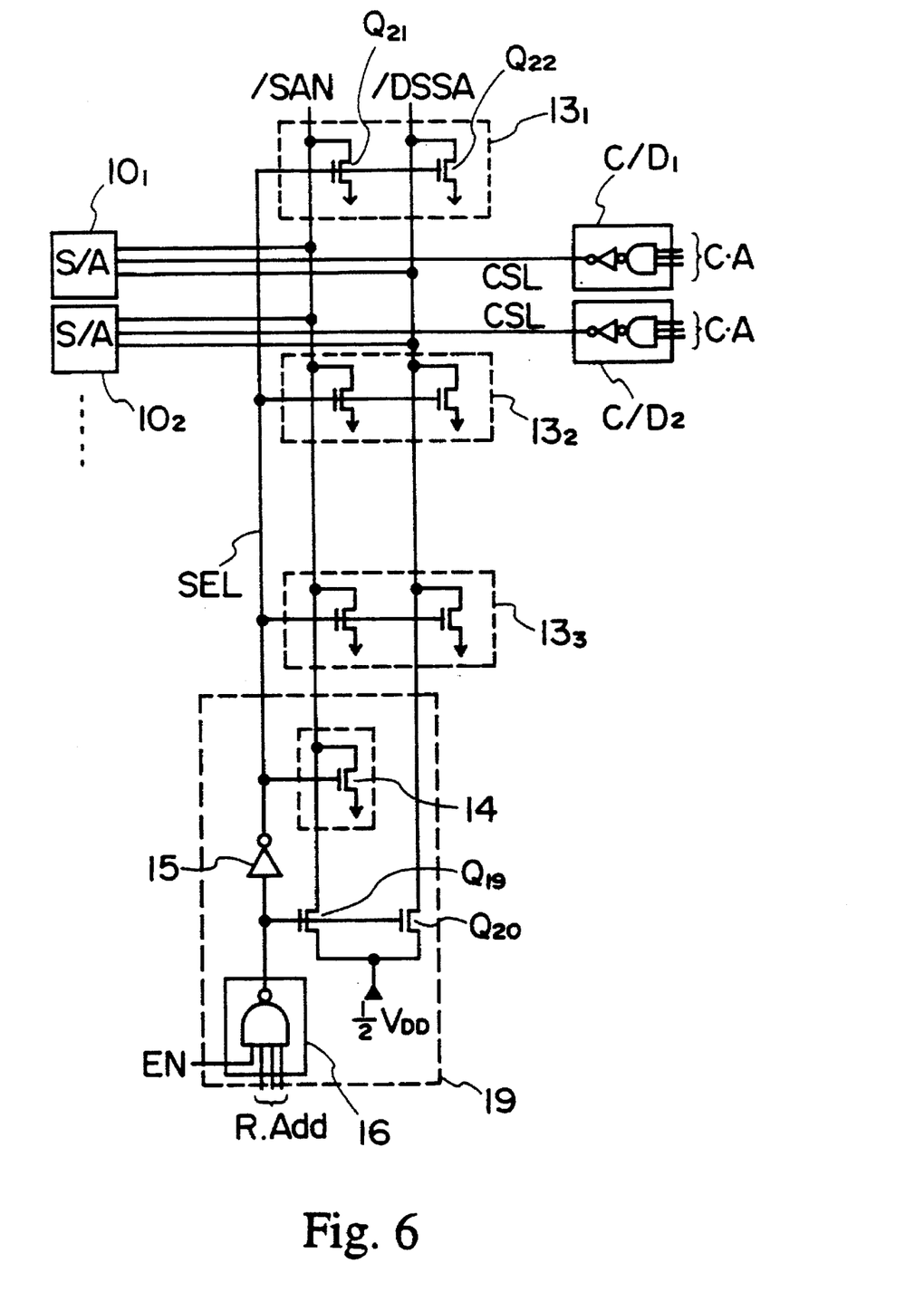
FIG. 6 is a circuit diagram showing more details of the FIG. 3 circuit.

FIG. 6 illustrates in greater detail a sense amplifier drive line selecting circuit. It is most preferred that the sense amplifier drive line selecting circuit have a high drive capability for quickly charging or discharging a drive terminal of a sense amplifier at high speed. For example, a MOS transistor having a large driving capability might be used for the sense amplifier drive line selecting circuit. Conventionally such a transistor with a large driving capability has a high width and takes up a considerable surface area on the chip. Sense amplifier drive lines/SAN and/DSSA are respectively connected via MOS transistors Q19 and Q20 to a supply terminal having a potential of ½ $V_{CC}$. Drive transistors are provided to pull drive lines/SAN and/DSSA from ½ $V_{CC}$ to $V_{SS}$. In the sense amplifier drive line selecting circuit shown in FIG. 6, a plurality of drive transistors in spaced apart relationship are provided to form a distributed array of drive transistors. A drive circuit 13 is divided into a plurality of portions each including a pair of N-channel MOS transistors for driving/SAN and/DSSA to the ground level. The gate of each driving MOS transistor is driven by the same control signal line SEL. The control signal SEL is formed by inverter circuit 15 from the output of the decoder circuit 16 which generates the select signal from the row address signals R. Add. The MOS transistors Q19 and Q20 are driven by the output of decoder circuit 16. The column decoder circuit C/D drives the column select line CSL based on the column address signals C.Add. Numeral 14 designates an auxiliary transistor for driving/ SAN to further enhance the driving capacity of the drive circuitry. Use of the circuitry in conjunction with the distributed MOS driver transistors provides an effect similar to that of a MOS transistor having substantially high drive capacity so that a high-speed sense amplifier drive line can be driven with a small increase in the chip area.

Figure 7:
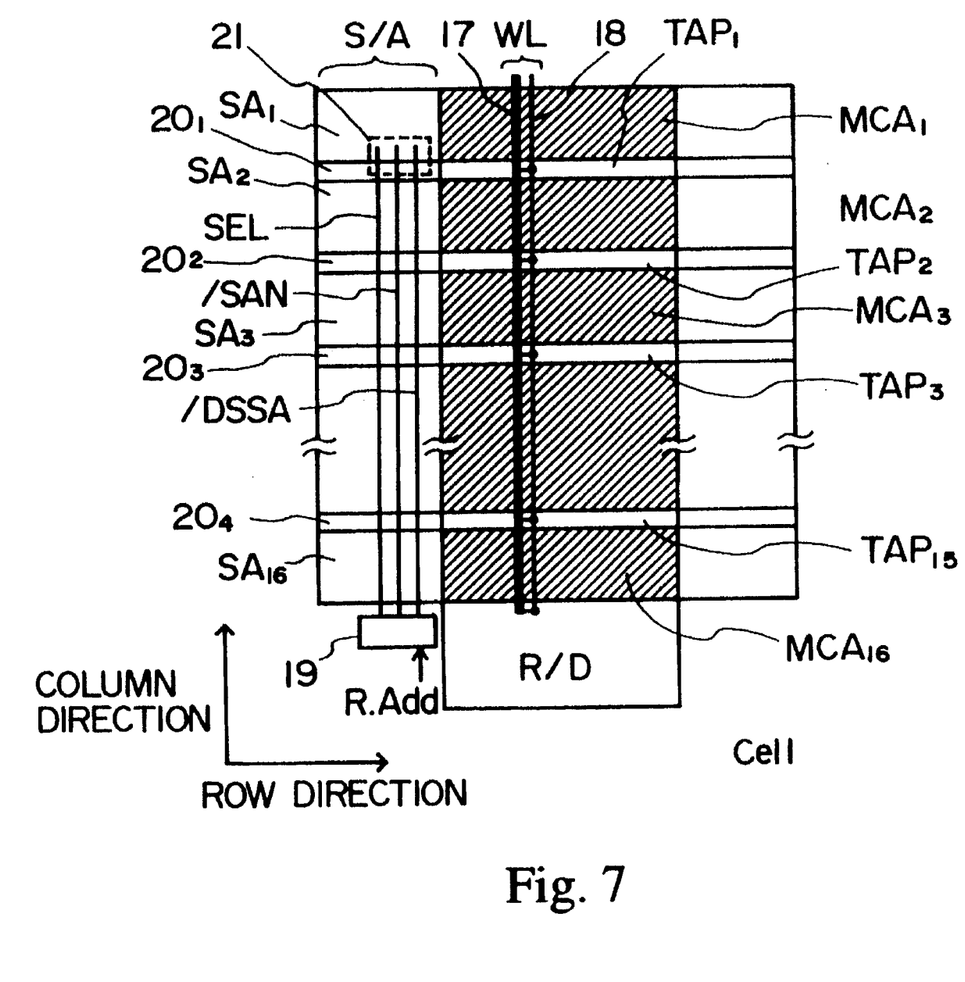
FIG. 7 is a plan view showing a layout of the FIG. 6 circuit.

Next, the layout configuration of a driving transistor region 13 is provided with reference to FIG. 7. FIG. 7 shows a pattern layout of a memory array Cell interposed between the peripheral circuits within two core sections S/A. The memory cell array Cell is divided into 16 memory cell regions MCA in the column direction and TAP (or shunt) regions TAP are interposed between the respective memory cell regions MCA. The word line WL extends over all the memory cell regions having a polysilicon wiring 18 constituting the gates of the transistors in the memory cell. A metal wiring 17 having a low resistance is arranged above and in parallel with the polysilicon wiring 18, and the metal wiring 17 and the polysilicon wiring 18 are connected at a regular intervals to compensate for the high resistance of the polysilicon wiring 18. Such "shunt" structures serve to ensure that the same voltage is present along the length of the polysilicon wiring 18 by providing a low resistance path between points along the length of the polysilicon wiring. Conventionally, the metal and polysilicon wirings are connected through vertical vias formed in TAP regions provided in between adjacent memory cell array regions. The sense amplifier circuits 10 are arranged in the sense amplifier regions S/A on either side of the memory cell region MCA. The drive transistors 13 of the sense amplifier drive line selecting circuit are respectively arranged at regions $20_1$-$20_{15}$ between the sense amplifiers, which area has conventionally not been used for forming circuitry within the memory array illustrated in FIG. 5. In this way, the increase in chip area associated with providing a high driving capacity transistor can be optimized by driving the high-speed sense amplifier drive line with an arrangement of distributed drive transistors located in the regions between the sense amplifiers and contiguous to the TAP regions formed between adjacent memory cell regions.

Figure 8:
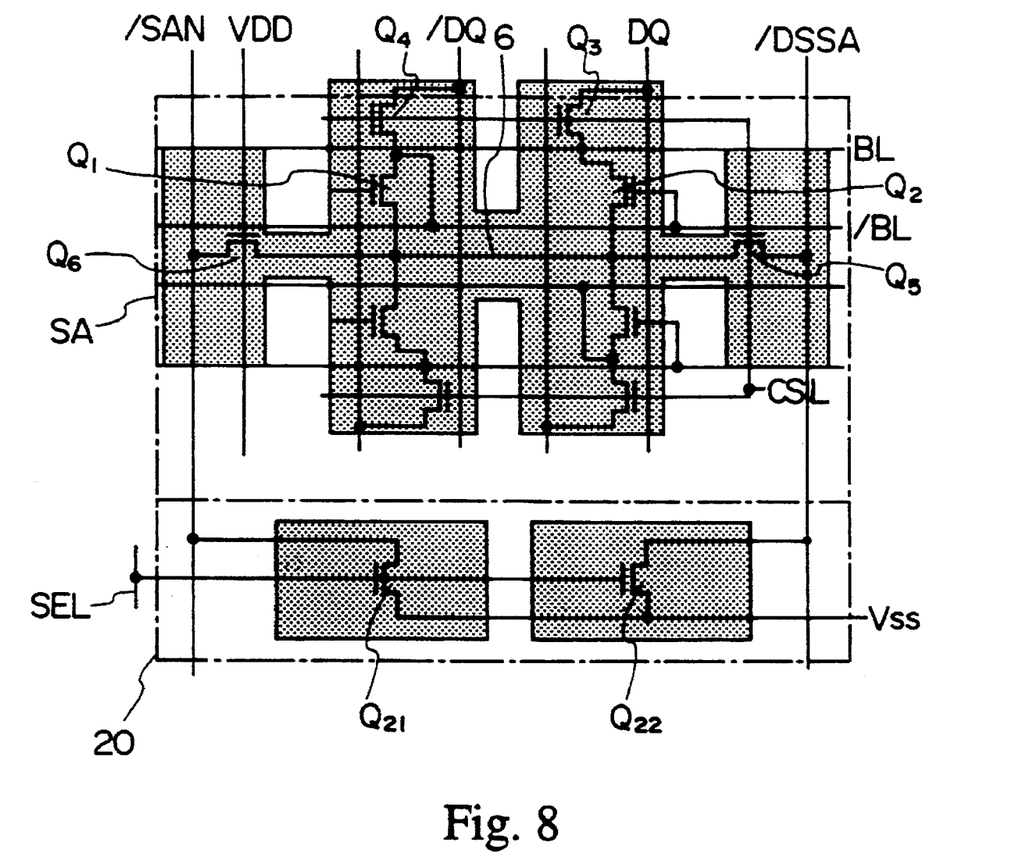
FIG. 8 is a plan view showing details of the FIG. 7 layout.
Figure 9:
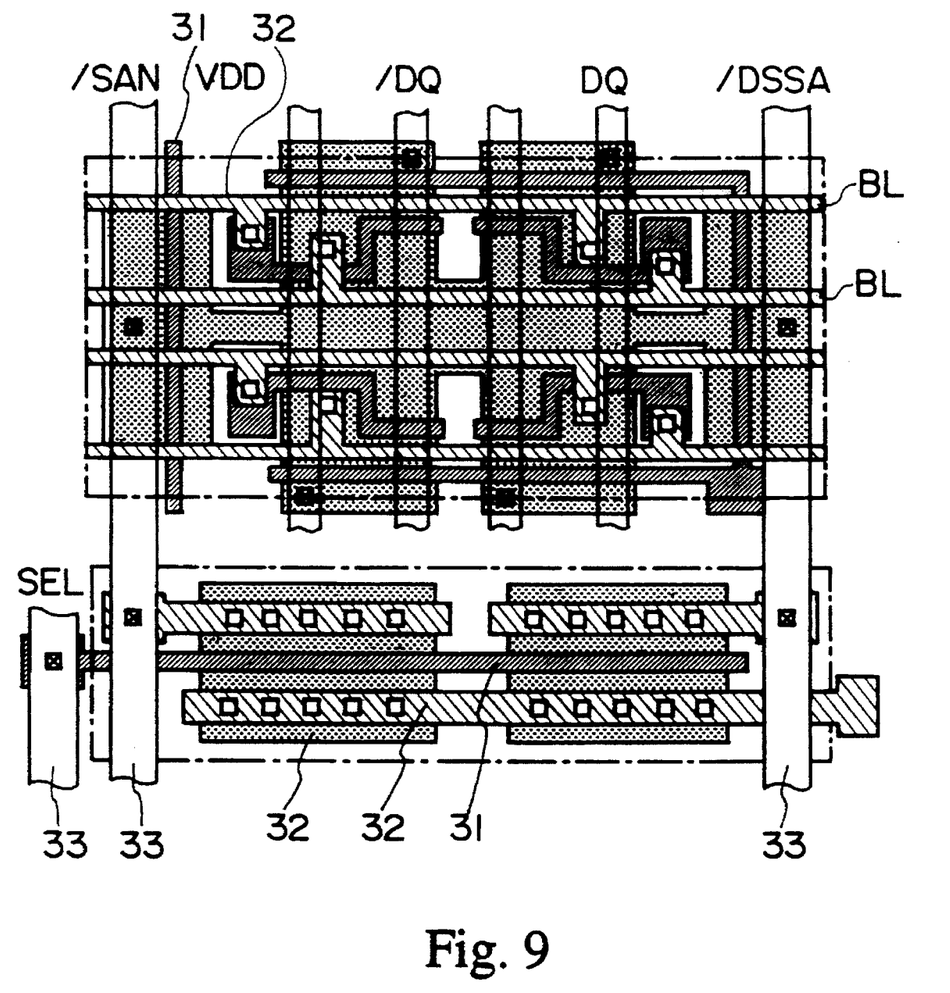
FIG. 9 is a plan view showing more details of the FIG. 7 layout.

FIG. 8 and FIG. 9 show more details about the layout of a region 21 of FIG. 7; the N-channel sense amplifiers for two pairs of bit lines and the driving MOS transistors Q21 and Q22 are shown. In FIG. 9, numeral 31 designates a first layer of polysilicon, numeral 32 designates a second layer of polysilicon and numeral 33 designates a metal wiring layer. As shown in FIG. 8, the MOS transistors Q1, Q4 and Q2, Q3 are respectively connected (either the sources or the drains are connected in common). Further, in the MOS transistors Q1 and Q2, the source regions are made common to form the drive terminal 6. When the illustrated transistors are arranged in such a manner, it is possible to continuously arrange them over a plurality of pairs of bit lines by connectedly arranging the column select transistors and the transistors constituting the sense amplifiers. Consequently, the area of the sense amplifier regions can significantly be diminished.

The specific embodiments of the invention discussed above primarily relate to a DRAM in which a sense amplifier is switchably connected to a discharge circuit which discharges a node of the sense amplifier at a high speed. The node of the sense amplifier is also coupled to a discharge circuit which discharges the node at a slower speed. Preferably, only the node of a selected sense amplifier is discharged at high speed allowing for the high speed activation of the selected sense amplifier with the associated current consumption being limited to that necessary to discharge the individual sense amplifier selected. The use of two discharge circuits is preferably implemented with two N channel MOS transistors connecting the node of the sense amplifier to two drive lines driven independent circuits. In a particularly preferred embodiment, the higher speed discharge circuit is implemented as an N channel MOS transistor which is switched by a signal from the column select line.

Aspects of the present invention might be used in other memory environments. For example, in ferroelectric random access memory (FRAM) devices, it is generally preferred to use a sense amplifier formed from P channel MOS transistors for amplifying the potential differences that are provided to the bit lines of a FRAM memory cell. Such a P channel sense amplifier section is illustrated in FIG. 5 and includes transistors $Q_7$ and $Q_8$. As is discussed above with respect to FIG. 5, a sense amplifier composed of P channel MOS transistors is activated by providing a signal which increases from ½ $V_{CC}$ up to $V_{CC}$ to the node 11 connecting the sources of the transistors $Q_7$ and $Q_8$. Since the line which drives that node is connected to many sense amplifiers, the sense amplifier drive signal will experience a large capacitance much like the sense amplifier drive signal of the N channel sense amplifier shown in FIG. 5.

To reduce the delay that might be associated with driving the sense amplifier of a FRAM, it may be desirable to limit the capacitance experienced when the sense amplifier drive circuitry is turned on to activate such a P channel MOS transistor sense amplifier arrangement. This can be achieved by providing circuitry which drives only a selected one of the P channel sense amplifiers at a time. Accordingly, it may be desirable to provide circuitry that can switchably connect the node of a selected P channel sense amplifier to a high speed charging circuit for rapidly charging the node of the selected P channel sense amplifier. Such circuitry could be very similar to that shown for switchably connecting the lines/SAN and/DSSA to the N channel sense amplifier of FIG. 5. It may, however, be preferable to use P channel transistors as the switch elements for connecting one or more lines such as SAP to the P channel sense amplifier, rather than the N channel transistor switch elements preferably used as switches in connection with the N channel sense amplifier. For such a high speed charging circuit used to drive a P channel sense amplifier, it is still typically preferred that a column select line CSL signal be provided to the switch transistor to activate the sense amplifier at high speed. If a P channel transistor is used as the switch that is driven by the CSL line, then it would typically be necessary to provide an inverter between the CSL line and the gate of the P channel transistor to ensure proper switching behavior.

It may be desirable to use embodiments of the present invention in other memory architectures. For example, in a memory in which a subset of a block of memory cells is selected for simultaneous output, it may be desirable to select the entire block of memory cells at high speed. For such a configuration, a performance improvement may still be obtained without an unacceptable increase in current consumption be selectively activating a predetermined number of sense amplifiers. Such a circuit arrangement could be implemented with only a single drive line for selectively activating a set of sense amplifiers. More particularly, it may be possible to provide a single drive line for selectively activating the set of sense amplifiers, with for example, a column line select signal providing the signal for selecting the set of sense amplifiers.

By using the preferred embodiments present invention, it is possible to provide a semiconductor memory achieving a high speed without increasing a chip area and without increasing power consumption. While the present invention has been described in terms of certain preferred embodiments of the invention, many variations and different implementations of the present invention will be apparent to those of ordinary skill in the art. Some of these variations and modifications have been described above. Other variations will be apparent to those of ordinary skill in the art.

What is claimed is:

1. A semiconductor memory comprising:

a memory cell block having alternatively arranged pluralities of memory cell arrays and pluralities of peripheral circuit sections, each of the memory cell arrays having a plurality of memory cells arranged in a matrix, the memory cells of one column being connected to one pair of bit lines, each of the peripheral circuit sections having a plurality of data lines for transferring data from and to the memory cells, a plurality of column select transistors for selectively connecting the pair of bit lines to the data lines, and a plurality of sense amplifier circuits for amplifying data read out from the memory cells;

a plurality of column select lines each extending over the memory cell arrays for selectively controlling the column select transistors, the plurality of column select lines arranged parallel to the pair of bit lines;

a column select circuit for selecting and during the column select line in response to a first address signal;

a plurality of first and second sense amplifier drive lines arranged along the peripheral circuit sections;

a sense amplifier drive line selecting circuit for selecting and driving the first and the second sense amplifier drive line in response to a second address signal;

a plurality of resistor elements respectively arranged between the sense amplifier circuits and the first sense amplifier drive lines; and a plurality of sense amplifier activating transistors respectively connected between the sense amplifier circuits and the second sense amplifier drive lines and controlled by the column select lines.

2. The semiconductor memory according to claim 1, wherein each of the resistor elements is a MOS transistor having a predetermined potential applied to a gate of the MOS transistor.

3. The semiconductor memory according to claim 1, wherein each of the peripheral circuit sections is shared by two adjacent ones of the memory cell arrays.

4. The semiconductor memory according to claim 1, wherein the sense amplifier drive line selecting circuit has a plurality of driving MOS transistors for driving the sense amplifier drive lines, and the driving MOS transistors are arranged in a distributed, spaced apart relationship along the sense amplifier drive lines.

5. The semiconductor memory according to claim 4, further comprising a plurality of regions separating memory cells, wherein the driving MOS transistors are located adjacent to the regions separating memory cells.

6. The semiconductor memory according to claim 5, wherein the memory cells comprise at least one MOS transistor having a gate, wherein the gates of a plurality of adjacent ones of the memory cells consist of a gate wiring, the semiconductor memory further comprising a metal wiring layer formed above the gates of the plurality of adjacent ones of the memory cells, the metal wiring layer being less resistive than the gate wiring, and wherein a plurality of interconnections are formed between the gate wiring and the metal wiring layer, with individual ones of the plurality of interconnections being located in the regions separating memory cells.

7. The semiconductor memory according to claim 1, wherein the sense amplifier drive line selecting circuit drives the first sense amplifier drive lines with more current than the sense amplifier drive line selecting circuit drives the second sense amplifier drive lines.

8. The semiconductor memory according to claim 3, wherein the sense amplifier drive line selecting circuit drives the first sense amplifier drive lines with more current than the sense amplifier drive line selecting circuit drives the second sense amplifier drive lines.

9. The semiconductor memory according to claim 4, wherein the sense amplifier drive line selecting circuit drives the first sense amplifier drive lines with more current than the sense amplifier drive line selecting circuit drives the second sense amplifier drive lines.

10. A semiconductor memory comprising:

a bit line pair having a first and second bit line;

a first transistor, the drain of which is connected to the first bit line, the gate of which is connected to the second bit line, and the source of which is connected to a first node;

a second transistor, the drain of which is connected to the second bit line, the gate of which is connected to the first bit line, and the source of which is connected to the first node;

a data line pair having a first and second data line;

a third transistor connected between the first bit line and the first data line;

a fourth transistor connected between the second bit line and the second data line;

a first and a second sense amplifier drive line;

a fifth transistor connected between the first node and the second sense amplifier drive line, the gate of the fifth transistor being connected to a second node supplied with a predetermined potential;

a sixth transistor connected between the first node and the first sense amplifier drive line;

a column selection line connected to the gates of the third, the fourth, and the sixth transistors;

a first driver circuit for driving the column selection line in response to first address signals;

a second driver circuit for driving the first sense amplifier drive line in response to second address signals; and a third driver circuit for driving the second sense amplifier drive line in response to the second address signals.

11. The semiconductor memory according to claim 10 wherein the second driver circuit has first means for supplying to the first sense amplifier drive line a first potential which is higher than a ground potential and lower than a power supply potential and second means for discharging the first sense amplifier drive line to the level of the ground potential.

12. The semiconductor memory according to claim 11 wherein the third driver circuit has third means for supplying the first potential to the second sense amplifier drive line, and fourth means for discharging the second sense amplifier drive line to the level of the ground potential.

13. The semiconductor memory according to claim 12 wherein the second means and the fourth means are N-channel MOS transistors, and wherein the sum of the currents flowing through the MOS transistors in the second means is larger than the sum of the currents flowing through the MOS transistors in the fourth means.

14. The semiconductor memory according to claim 12 wherein the first driver circuit includes an inverter circuit connected to the column selection line and a logic circuit for receiving the first address signals.

15. A semiconductor memory, comprising:
a memory cell array divided along a column direction into a plurality of blocks each having a plurality of memory cells arranged in a matrix, a plurality of first areas being interposed between the blocks;
a plurality of word lines each connected to the memory cells in one row;
a plurality of bypass word lines each corresponding to one of the word lines and connected to the word line in the first areas;
a row decoder for selecting and driving the word lines based on a first row address;
a sense amplifier array divided along the column direction into a plurality of sense amplifier blocks each having a plurality of sense amplifier circuits each connected to the memory cells in one column, a plurality of second areas being interposed between the sense amplifier blocks;
a first, a second and a third wiring arranged in parallel and coupled to the sense amplifier blocks; and
means for driving the first, the second and the third wiring based on a second row address;
wherein each of the sense amplifier circuits comprises:
a first transistor, the drain of which is connected to a first bit line, the gate of which is connected to a second bit line, and the source of which is connected to a first node;
a second transistor, the drain of which is connected to the second bit line, the gate of which is connected to the first bit line, and the source of which is connected to the first node;
a third transistor connected between the first bit line and a first data line;
a fourth transistor connected between the second bit line and a second data line;
a fifth transistor connected between the first node and the second wiring, the gate of the fifth transistor being connected to the first wiring;
a sixth transistor connected between the first node and the third wiring; and
a column selection line connected to the gates of the third, the fourth, and the fifth transistors.

16. The semiconductor memory according to claim 15 wherein the word lines and the bypass word lines are in different metal layers.

17. The semiconductor memory according to claim 16 the metal layer of the bypass word lines is located above the metal layer of the word lines.

18. The semiconductor memory according to claim 15 wherein the means for driving the first, the second and the third wirings includes first discharge transistors for discharging the second wiring to a ground potential, and second discharge transistors for discharging the third wiring to the ground potential.

19. The semiconductor memory according to claim 18 wherein the first and the second transistors are arranged in a distributed, spaced apart relationship within the second areas.

20. A semiconductor memory comprising:
an array of memory cells;
a plurality of bit line pairs, each of the bit line pairs having a first and second bit line, each bit line pair being coupled to at least one memory cell;
a column selection line for selecting a pair of bit lines from the plurality of bit line pairs;
a first driver circuit for driving the column selection line in response to first address signals;
a sense amplifier comprising a first and a second transistor, the drain of the first transistor connected to a particular first bit line, the gate of the first transistor connected to a corresponding second bit line and the source of the first transistor connected to a first node, and the drain of the second transistor connected to the corresponding second bit line, the gate of the second transistor connected to the particular first bit line and the source of the second transistor connected to the first node;
a first sense amplifier drive line;
switch means for switchably connecting the first node to the first sense amplifier drive line, the switch means being controlled by the column selection line to provide a first potential to the first node to place the sense amplifier in an inactive state, the switch means providing a second potential to the first node to place the sense amplifier in an active state.

21. The semiconductor memory of claim 20, wherein the switch means comprises a third transistor and wherein the column select line is connected to a gate of the third transistor.

22. The semiconductor memory of claim 21, further comprising:
a data line pair having a first and second data line;
a fourth transistor connected between the first bit line and the first data line;
a fifth transistor connected between the second bit line and the second data line, wherein the column selection line is connected to the gates of the third, the fourth, and the fifth transistors.

23. The semiconductor memory, of claim 22, further comprising:
a second sense amplifier line;
a sixth transistor connected between the first node and the second sense amplifier drive line;
a second driver circuit for driving the first sense amplifier drive line in response to second address signals; and
a third driver circuit for driving the second sense amplifier drive line in response to the second address signals.

24. The semiconductor memos, of claim 23, wherein the third driver circuit provides a first potential to the first node of a plurality of sense amplifiers at one time to place each of the plurality of sense amplifiers in an inactive state, the third driver circuit providing a second potential to the first node of the plurality of sense amplifiers to place each of the plurality of sense amplifiers in an active state.

25. The semiconductor memory of claim 20, further comprising a sense amplifier selecting circuit coupled to a plurality of sense amplifier drive lines, the sense amplifier selecting circuit having a plurality of driving MOS transistors for driving the sense amplifier drive lines, wherein the driving MOS transistors are arranged in a distributed, spaced apart relationship along the sense amplifier drive lines.

26. The semiconductor memory according to claim 25, further comprising a plurality of regions separating memory cells, wherein the driving MOS transistors are located adjacent to the regions separating memory cells.

27. The semiconductor memory according to claim 26, wherein the memory cells comprise at least one MOS transistor having a gate, wherein the gates of a plurality of adjacent ones of the memory cells consist of a gate wiring, the semiconductor memory further comprising a metal wiring layer formed above the gates of the plurality of adjacent ones of the memory cells, the metal wiring layer being less resistive than the gate wiring, and wherein a plurality of interconnections are formed between the gate wiring and the metal wiring layer, with individual ones of the plurality of interconnections being located in the regions separating memory cells.

28. A method for activating a sense amplifier circuit of semiconductor memory, the sense amplifier circuit comprising:

- a first transistor, the drain of which is connected to a first bit line, the gate of which is connected to a second bit line, and the source of which is connected to a first node;
- a second transistor, the drain of which is connected to the second bit line, the gate of which is connected to the first bit line, and the source of which is connected to the first node;
- a third transistor connected between the first node and a second node, the gate of the third transistor being connected to a third node; and
- a fourth transistor connected between the first node and a fourth node, the gate of the fourth transistor being connected to a fifth node;

the method comprising:

in a precharging mode, providing VMM to the second and fourth nodes, providing VDD to the third node, and providing VSS to the fifth node; and in an activation mode, providing VSS to the second and fourth nodes, and providing VDD to the third node and fifth nodes, wherein the following equation is satisfied:

$$VSS<VMM<VDD.$$

29. The method according to claim 28 wherein the following equation is satisfied:

$$VMM=0.5\times(VDD-VSS).$$

30. The method according to claim 29 wherein the first to fourth transistors are N-channel transistors.

31. The semiconductor memory according to claim 1, wherein the sense amplifier circuits comprise two N-channel MOS transistors.

* * * * *